(12) United States Patent
Cox et al.

(10) Patent No.: US 7,039,302 B2
(45) Date of Patent: May 2, 2006

(54) PTC HEATER WITH FLEXIBLE PRINTED CIRCUIT BOARD

(75) Inventors: Robert G. Cox, Goshen, IN (US); James T. Blake, Wolcottville, IN (US); Gavin L. Replogle, Kendallville, IN (US); David W. Kompara, Fort Wayne, IN (US); Aaron L. Hooks, Warsaw, IN (US)

(73) Assignee: Dekko Technologies, Inc., North Webster, IN (US)

( * ) Notice: Subject to any disclaimer, the term of this patent is extended or adjusted under 35 U.S.C. 154(b) by 0 days.

(21) Appl. No.: 11/108,996

(22) Filed: Apr. 19, 2005

(65) Prior Publication Data

US 2005/0184047 A1 Aug. 25, 2005

Related U.S. Application Data

(63) Continuation of application No. 10/366,974, filed on Feb. 14, 2003.

(60) Provisional application No. 60/357,517, filed on Feb. 15, 2002.

(51) Int. Cl.
  *F24F 6/00* (2006.01)

(52) U.S. Cl. ........................... 392/390; 392/392

(58) Field of Classification Search ............... 392/386, 392/387, 390, 392; 219/541, 542, 504, 505, 219/506; 174/254, 255; 439/67, 68, 77, 439/78, 79
See application file for complete search history.

(56) References Cited

U.S. PATENT DOCUMENTS

| | | | |
|---|---|---|---|
| 4,733,057 A | 3/1988 | Stanzel et al. | 219/548 |
| 4,888,465 A | 12/1989 | Hoffmann | 219/301 |
| 5,062,145 A | 10/1991 | Zwaan et al. | 392/396 |
| 5,181,006 A | 1/1993 | Shafe et al. | 338/22 |
| 5,233,325 A | 8/1993 | Takeda | 337/107 |
| 5,521,357 A | 5/1996 | Lock et al. | 219/543 |
| 5,645,746 A | 7/1997 | Walsh | 219/505 |
| 5,867,895 A | 2/1999 | Van Beneden et al. | 29/827 |
| 5,940,577 A | 8/1999 | Steinel | 392/395 |
| 6,104,866 A | 8/2000 | DeWitt et al. | 392/390 |
| 6,285,005 B1 | 9/2001 | Aakalu et al. | 219/209 |
| 6,311,868 B1 | 11/2001 | Krietemeier et al. | 222/1 |
| 6,411,776 B1 | 6/2002 | Millan | 392/395 |

*Primary Examiner*—Sang Paik
(74) *Attorney, Agent, or Firm*—Taylor & Aust, P.C.

(57) ABSTRACT

An electrically heated chemical delivery system including a heat sensitive chemical and an electrical heater adjacent to the heat sensitive chemical. The heater includes a heater element with a first heater side and a second heater side and a flexible printed circuit in electrical contact with both the first heater side and the second heater side. The flexible printed circuit includes at least one fold allowing electrical contact with both the first heater side and the second heater side.

16 Claims, 1 Drawing Sheet

PTC HEATER WITH FLEXIBLE PRINTED CIRCUIT BOARD

CROSS REFERENCE TO RELATED APPLICATIONS

This is a continuation of U.S. patent application Ser. No. 10/366,974, entitled "PTC HEATER WITH FLEXIBLE PRINTED CIRCUIT BOARD", filed Feb. 14, 2003, which claims the benefit of Provisional Application No. 60/357,517, filed Feb. 15, 2002.

BACKGROUND OF THE INVENTION

1. Field of the Invention

The present invention relates to an electrically heated chemical delivery system, and, more particularly, to a PTC electrical heater including a flexible printed circuit.

2. Description of the Related Art

A positive temperature coefficient of resistance (PTC) material exhibits the characteristic that, as the temperature of the material rises, the electrical resistance of the material also rises. If an electrical component is composed of PTC material, and if a voltage is applied to the component, the component will dissipate energy at a rate of $V^2/R$ where $V$ is the applied voltage and $R$ is the instantaneous resistance of the component. Unless sufficiently cooled, the PTC electrical component will heat up as a result of the dissipated energy and thereby increase the material resistance which will decrease the electrical current through the component and decrease the energy dissipation of the component. The PTC component is therefore somewhat self limiting from an electrical current point of view.

A Positive Temperature Coefficient (PTC) heater circuit applies an electrical potential on opposite sides of a PTC material to generate heat. As the temperature of the PTC material increases, the electrical resistance also increases. Typical PTC heater circuits use an insulating film and two metal electrodes in proximity to a heat sinking/distributive surface. Although this construction technique is effective to produce a properly operating PTC heater, it can be relatively expensive in terms of fabrication and assembly.

What is needed in the art is a PTC heater which is easily and cost effectively fabricated.

SUMMARY OF THE INVENTION

The present invention provides a PTC heater including a flexible printed circuit with printed electrodes on an insulative substrate.

The invention comprises, in one form thereof, an electrically heated chemical delivery system, comprising a heat sensitive chemical and an electrical heater adjacent to the heat sensitive chemical. The heater includes a heater element with a first heater side and a second heater side and a flexible printed circuit in electrical contact with both the first heater side and the second heater side. The flexible printed circuit includes at least one fold allowing electrical contact with both the first heater side and the second heater side.

An advantage of the present invention is a PTC heater which is easily and cost effectively fabricated.

Another advantage of the present invention is PTC material can be printed on the flexible printed circuit.

Yet another advantage of the present invention is the flexible printed circuit can include additional components, such as a fuse and indicator light with relatively small incremental manufacturing expense.

A yet further advantage of the present invention is a reduction in the number of parts required to assemble the electrical heater.

An even yet further advantage of the present invention is an increase in reliability due to the number of parts reduction.

BRIEF DESCRIPTION OF THE DRAWINGS

The above-mentioned and other features and advantages of this invention, and the manner of attaining them, will become more apparent and the invention will be better understood by reference to the following description of an embodiment of the invention taken in conjunction with the accompanying drawings, wherein.

Corresponding reference characters indicate corresponding parts throughout the several views. The exemplification set out herein illustrates one preferred embodiment of the invention, in one form, and such exemplification is not to be construed as limiting the scope of the invention in any manner.

DETAILED DESCRIPTION OF THE INVENTION

Figure 1:
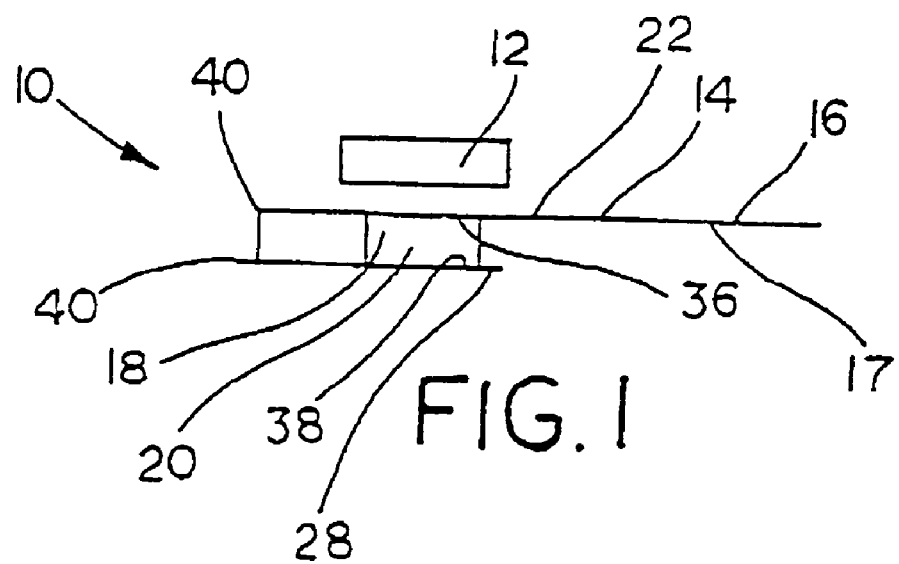
FIG. 1 is a side view of an embodiment of the electrically heated chemical delivery system of the present invention showing a flexible printed circuit folded around a heater element.

Referring now to the drawings, and more particularly to FIG. 1, there is shown an electrically heated chemical delivery system 10 which generally includes heat sensitive chemical 12 adjacent electrical heater 14. Heat sensitive chemical 12 is shown schematically in FIG. 1.

Heat sensitive chemical 12 can include, but is not limited to, fragrances, insecticides, air fresheners, aromatherapy chemicals, anti-mold compounds, anti-mildew compounds and other chemicals. Heat sensitive chemical 12 can be in the form of capsules, packets, gels, liquids, solids and the like. Heat sensitive chemical 12 and adjacent electrical heater 14 are typically contained in a suitable housing (not shown). Upon receiving heat energy from heater 14, heat sensitive chemical 12 releases a portion of its chemical to the ambient.

Electrical heater 14 includes flexible circuit 16 (FIG. 2), which can be a flexible printed circuit, folded at least partially around heater element 18, and in electrical contact with both first heater side 36 and second heater side 38 of heater element 18. Heater element 18 can include positive temperature coefficient material 20 which can be any one of many suitable PTC materials, or combinations thereof. Alternatively, flexible circuit 16 can be in electrical contact at least one side of heater element 18.

Flexible circuit 16 includes a flexible insulating substrate 22, electrical traces 24 and indicator light 26. Insulating substrate 22 is formed of any suitable material which is flexible and has preselected electrical characteristics necessary for operation of electrical heater 14. First circuit side 17 of flexible circuit 16 is shown as including all of electrical traces 24 and indicator light 26, however, flexible circuit 16 can alternatively be a double sided printed circuit or a multilayer printed circuit.

Electrical traces 18 include leads 28, contact pads 30, 31 and printed fuse 32. Leads 28 are connected to a suitable source of electrical power (not shown). Contact pads 30,31 electrically contact opposing sides of heater element 18 when flexible circuit 16 is folded around heater element 18 (as shown in FIG. 1). Leads 28 are also connected in parallel with each of contact pads 30, 31 and indicator light 26. Printed fuse 32 is sized and configured to open at a preselected current therethrough.

Figure 2:
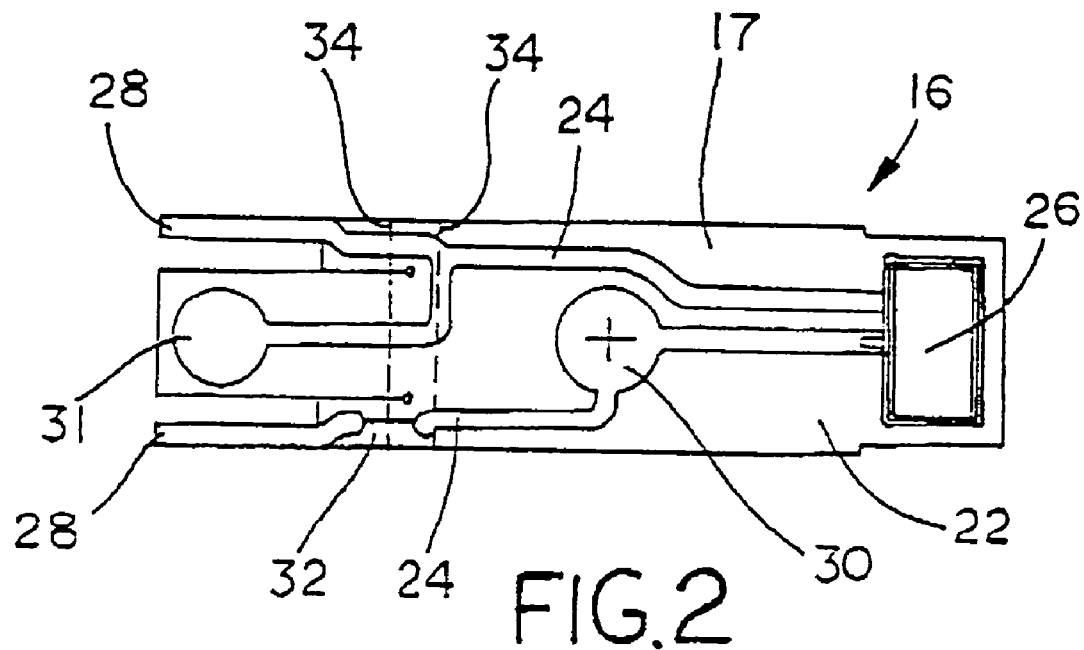
FIG. 2 is a plan view of the printed flexible circuit of FIG. 1 in an unfolded state.

Flexible circuit 16 carries electrical traces 24 thereon and is sized and configured to fold around heater element 18, such as at fold lines 34, shown as dashed lines in FIG. 2, and resulting, for example, in folds 40. The number of folds 40 is at least one but can include two or more as dictated by the application. Likewise, the angle of folds 40, can be 90° as shown or can be other angles depending, in part, on the number of folds among other factors such as the flexibility of substrate 22 and electrical traces 24. The particular location at which flexible circuit 16 is folded may vary from one application to another. The specific size, configuration and geometrical shape of flexible circuit 16, electrical traces 24 and heater element 18 can be varied depending on the application.

The method of assembling electrical heater 14 includes the steps of electrically connecting a first lead 28 of flexible printed circuit 16 to first heater side 36 by electrically contacting first heater side 36 with first contact pad 30; folding flexible printed circuit 16 at least partially around heater element 18; and electrically connecting second lead 28 of flexible printed circuit 16 to second heater side 38 by electrically contacting second heater side 38 with second contact pad 31. Heater sides 36, 38 can be electrically connected to respective contact pad 30,31 with solder, conductive adhesives and the like. Electrical heater 14 is assembled with only two separate components thereby achieving the aforementioned manufacturing and reliability advantages. Alternatively, positive temperature coefficient material 20 can be printed on flexible circuit 16 at either of contact pads 30, 31.

In use, heat sensitive chemical 12 is located adjacent electrical heater 14, typically by way of a suitable housing (not shown) or the like. Electrical heater 14 is connected to a suitable source of electrical power (not shown) and thereby commences generating heat. Heat from electrical heater 14 reaches nearby heat sensitive chemical 12 thereby dispersing some of the chemical of heat sensitive chemical 12 into the ambient. Indicator light 26 can indicate when power is applied to electrical heater 14.

While this invention has been described as having a preferred design, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

The invention claimed is:

1. An electrically heated chemical delivery system, comprising:
   a heat sensitive chemical; and
   an electrical heater adjacent said heat sensitive chemical, said heater including:
      a heater element having a first heater side and a second heater side; and
      a flexible printed circuit in electrical contact with both said first heater side and said second heater side, said flexible printed circuit including a flexible insulating substrate, with a plurality of electrical traces thereon, both said flexible insulating substrate and at least some of said plurality of electrical traces are folded to allow said electrical contact with both said first heater side and said second heater side.

2. The electrically heated chemical delivery system of claim 1, wherein said heater element includes a positive temperature coefficient material.

3. The electrically heated chemical delivery system of claim 2, wherein said flexible printed circuit folds at least partially around said positive temperature coefficient material.

4. The electrically heated chemical delivery system of claim 1, wherein said flexible printed circuit includes a first circuit side which electrically contacts both said first heater side and said second heater side.

5. The electrically heated chemical delivery system of claim 1, said flexible printed circuit including a first lead, a second lead, a first contact pad, a second contact pad, a printed fuse and an indicator light, said first lead electrically connected to said printed fuse, said printed fuse electrically connected to said first contact pad, said first contact pad electrically connected to said indicator light, said second lead electrically connected to both said second contact pad and said indicator light, said first contact pad electrically connected to said first heater side, said second contact pad electrically connected to said second heater side, all of said first lead, said second lead, said first contact pad, said second contact pad, said printed fuse and said indicator light printed on said flexible insulating substrate.

6. An electrical heater, comprising:
   a heater element having a first heater side and a second heater side; and
   a flexible printed circuit in electrical contact with both said first heater side and said second heater side, said flexible printed circuit including a flexible insulating substrate, with a plurality of electrical traces thereon, both said flexible insulating substrate and at least some of said plurality of electrical traces are folded to allow said electrical contact with both said first heater side and said second heater side.

7. The electrical heater of claim 6, wherein said heater element includes a positive temperature coefficient material.

8. The electrical heater of claim 7, wherein said flexible printed circuit folds at least partially around said positive temperature coefficient material.

9. The electrical heater of claim 6, wherein said flexible printed circuit includes a first circuit side which electrically contacts both said first heater side and said second heater side.

10. The electrical heater of claim 6, said flexible printed circuit including a flexible insulating substrate, a first lead, a second lead, a first contact pad, a second contact pad, a printed fuse and an indicator light, said first lead electrically connected to said printed fuse, said printed fuse electrically connected to said first contact pad, said first contact pad electrically connected to said indicator light, said second lead electrically connected to both said second contact pad and said indicator light, said first contact pad electrically connected to said first heater side, said second contact pad electrically connected to said second heater side, all of said first lead, said second lead, said first contact pad, said second contact pad, said printed fuse and said indicator light printed on said flexible insulating substrate.

11. A method of assembling an electrical heater, comprising the steps of:

electrically connecting a first lead of a flexible printed circuit to a first heater side of a heater element, said flexible printed circuit including a flexible insulating substrate;

folding both said flexible printed circuit and said flexible insulating substrate at least partially around said heater element; and electrically connecting a second lead of a flexible printed circuit to a second heater side of said heater element.

12. The method of claim 11, wherein said heater element includes a positive temperature coefficient material.

13. The method of claim 11, wherein said folding step includes both a first fold and a second fold of said flexible printed circuit.

14. The method of claim 11, wherein both said first heater side and said second heater side electrically contacts a first circuit side.

15. An electrically heated chemical delivery system, comprising:

a heat sensitive chemical; and an electrical heater adjacent said heat sensitive chemical, said heater including:

a heater element having a first heater side and a second heater side; and a flexible printed circuit in electrical contact with at least one of said first heater side and said second heater side, said flexible printed circuit including a flexible insulating substrate, with a plurality of electrical traces thereon, both said flexible insulating substrate and at least some of said plurality of electrical traces are folded to allow said electrical contact with both said first heater side and said second heater side.

16. The electrically heated chemical delivery system of claim 15, wherein said flexible printed circuit is in contact with both said first heater side and said second heater side.

* * * * *

UNITED STATES PATENT AND TRADEMARK OFFICE
CERTIFICATE OF CORRECTION

PATENT NO. : 7,039,302 B2  Page 1 of 1
APPLICATION NO. : 11/108996
DATED : May 2, 2006
INVENTOR(S) : Cox et al.

It is certified that error appears in the above-identified patent and that said Letters Patent is hereby corrected as shown below:

COLUMN 6
At line 13, please delete "both", and substitute therefore --at least one of--.

Signed and Sealed this

Twenty-sixth Day of December, 2006

JON W. DUDAS
*Director of the United States Patent and Trademark Office*